(12) United States Patent
Miura et al.

(10) Patent No.: US 8,338,287 B2
(45) Date of Patent: Dec. 25, 2012

(54) SEMICONDUCTOR DEVICE AND METHOD FOR MANUFACTURING THE SAME

(75) Inventors: Masayuki Miura, Tokyo (JP);
Katsuhiko Oyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/030,356

(22) Filed: Feb. 18, 2011

(65) Prior Publication Data

US 2011/0233793 A1    Sep. 29, 2011

(30) Foreign Application Priority Data

Mar. 24, 2010  (JP) .................................. P2010-068408

(51) Int. Cl.
*H01L 21/00*    (2006.01)
(52) U.S. Cl. ........................................ 438/614; 438/615
(58) Field of Classification Search ........... 438/612–616
See application file for complete search history.

(56) References Cited

U.S. PATENT DOCUMENTS

| 5,648,686 | A | 7/1997 | Hirano et al. | |
| 6,762,506 | B2 | 7/2004 | Amagai et al. | |
| 2001/0011771 | A1* | 8/2001 | Yoshida | 257/734 |
| 2004/0222522 | A1* | 11/2004 | Homma | 257/737 |
| 2006/0055037 | A1* | 3/2006 | Park et al. | 257/737 |

FOREIGN PATENT DOCUMENTS

| JP | 8-45939 | 2/1996 |
| JP | 11-330678 | 11/1999 |
| JP | 2003-203941 | 7/2003 |

* cited by examiner

*Primary Examiner* — Richard A. Booth
(74) *Attorney, Agent, or Firm* — Finnegan, Henderson, Farabow, Garrett & Dunner, L.L.P.

(57) ABSTRACT

In one embodiment, a preliminary solder layer made of a Sn alloy is formed on a connecting pad of a wiring substrate. A solder bump made of a Sn alloy is formed on an electrode pad of a semiconductor chip. After contacting the preliminary solder layer and the solder bump, the preliminary solder layer and the solder bump are melted by heating to a temperature of their melting points or higher to form a solder connecting part made of a Sn alloy containing Ag and Cu. Only the preliminary solder layer of the preliminary solder layer and the solder bump is composed of a Sn alloy containing Ag.

17 Claims, 2 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2010-068408, filed on Mar. 24, 2010; the entire contents of which are incorporated herein by reference.

FIELD

Embodiments described herein relates generally to a semiconductor device and a method for manufacturing the same.

BACKGROUND

To cope with pin multiplication, fine pitches, and increase in signal speed of semiconductor chips, used is a semiconductor device adopting flip-chip (FC) connection as amounting method with short wiring and connection lengths. The semiconductor chip has a solder bump formed on an electrode pad via a barrier metal layer. A wiring substrate to which the semiconductor chip is connected has a connecting pad corresponding to the electrode pad of the semiconductor chip and a preliminary solder layer formed on the connecting pad directly or via a barrier metal layer.

For the solder bump formed on the semiconductor chip and the preliminary solder layer formed on the wiring substrate, a Pb-free solder containing substantially no Pd is used. As the Pb-free solder, for example, a Sn alloy such as a Sn—Ag alloy, a Sn—Cu alloy, a Sn—Ag—Cu alloy, a Sn—Bi alloy or the like is used. The barrier metal layer mainly contains Ni and selected according to the compositions and the like of the solder bump and the preliminary solder layer. As the barrier metal layer, a stacked film such as, for example, Ni/Ti, Ni/Cu/Ti or the like is adopted.

Ag in the Sn—Ag alloy hardens the solder and therefore has an advantage of improving the connection strength by a solder connecting part (a melted solidified body of the solder bump and the preliminary solder layer) after FC connection. On the other hand, Ag decreases the creeping property of the solder connecting part and therefore cannot sufficiently relax the thermal stress generated in the solder bump based on the difference in thermal expansion coefficient between the semiconductor chip and the wiring substrate during FC connection. This causes a crack or delamination to easily occur in the semiconductor chip. Especially when a low dielectric constant insulating film (low-k film) capable of reducing the inter-wiring capacity is used for the interlayer insulating film of the semiconductor chip, the low-k film itself has a low strength and a low bonding strength with another film and therefore is susceptible to a crack or delamination.

Cu in the Sn—Cu alloy has advantages of improving the creeping property of the solder and relaxing the thermal stress generated in the solder bump. This makes it possible to suppress a crack and delamination of the semiconductor chip, particularly a crack and delamination of the low-k film. On the other hand, the solder is apt to embrittle because the crystal grains in the solder grow during relaxation of the thermal stress generated in the solder bump. This decreases the fatigue resistance of the solder connecting part. The decrease causes a crack or the like to occur in the solder connecting part when a thermal cycle test (TCT) is performed on the semiconductor device.

In a connection structure between the semiconductor device (semiconductor package) and the wiring substrate, a solder connecting part formed of a Sn—Au—Ag—Cu alloy is known. The solder bump is generally formed by electrolytic plating of alloy, but the alloy plating solution is expensive and has short lifetime, leading to increased forming cost of the solder bump. Adoption of stacked plating (stacking of plating of constituent elements of alloy) at low cost to the formation of the solder bump is under consideration, but Ag plating is formed in a recessed shape and greatly varies in film thickness and therefore it is difficult to control a very low concentration of about several percents.

DETAILED DESCRIPTION

According to one embodiment, provided is a method for manufacturing a semiconductor device including forming a preliminary solder layer made of a Sn alloy on a connecting pad of a wiring substrate, forming a solder bump made of a Sn alloy on an electrode pad of a semiconductor chip, contacting the preliminary solder layer and the solder bump while aligning, and melting the preliminary solder layer and the solder bump by heating to a temperature equal to or higher than melting points thereof to form a solder connecting part made of a Sn alloy containing Ag and Cu and connect the connecting pad of the wiring substrate and the electrode pad of the semiconductor chip. Only the preliminary solder layer of the preliminary solder layer and the solder bump is composed of a Sn alloy containing Ag.

Figure 1:
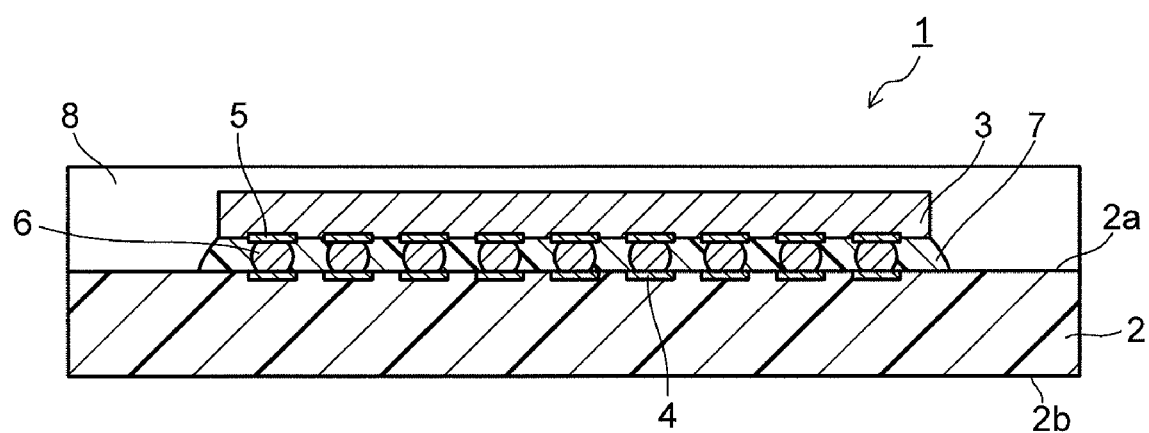
FIG. 1 is a sectional view illustrating a semiconductor device manufactured by adopting a manufacturing method of an embodiment.

The method for manufacturing the semiconductor device according to the embodiment will be described with reference to the drawings. FIG. 1 is a sectional view illustrating the configuration of the semiconductor device manufactured by adopting the manufacturing method of the embodiment. The semiconductor device 1 illustrated in FIG. 1 includes a wiring substrate 2 and a semiconductor chip 3 mounted on the wiring substrate 2. The semiconductor device 1 has a structure in which a connecting pad 4 of the wiring substrate 2 and an electrode pad 5 of the semiconductor chip 3 are electrically and mechanically connected by a solder connecting part 6, namely, a flip-chip (FC) connection structure. The solder connecting part 6 is electrically connected to both the electrode pad 5 of the semiconductor chip 3 and the connecting pad 4 of the wiring substrate 2.

The semiconductor chip 3 has a plurality of electrode pads 5 provided on an element forming surface (circuit forming surface) of a semiconductor substrate. Although illustration is omitted in FIG. 1, the semiconductor chip 3 has a semiconductor substrate such as a Si substrate or the like, a semiconductor element part formed on the semiconductor substrate, and a circuit part constituted of metal wires and insulating films. For the circuit part of the semiconductor chip 3, for example, Cu wires and low dielectric constant insulating films (low-k film) formed of an SiOF film, an SiOC film, an organic silica film, a porous film of one of these, or the like with a dielectric constant of 3.5 or less are used. The electrode pad 5 is electrically connected to the metal wire of the circuit part and is constituted of, for example, a stacked body of a Cu pad and an Al pad.

The wiring substrate 2 on which the semiconductor chip 3 will be mounted has a wiring network provided inside or on the surface of the insulating substrate such as an organic resin substrate. Concrete examples of the wiring substrate 2 includes a printed circuit board having a wiring network provided on an insulating resin substrate made of a glass-epoxy resin or a BT resin (Bsmaleimide-Triazine resin) or the like. The wiring substrate 2 has a first surface 2a that is a chip mounting surface and a second surface 2b that is opposite to the first surface 2a.

On the first surface 2a of the wiring substrate 2, a plurality of connecting pads 4 are arranged. The plurality of connecting pads 4 are arranged according to the arrangement form of the electrode pads 5 of the semiconductor chip 3. Although illustration is omitted in FIG. 1, external connection terminals of the semiconductor device 1 are provided on the second surface 2b of the wiring substrate 2. The external connection terminals are electrically connected to the connecting pads 4 via the wiring network of the wiring substrate 2. When the semiconductor device 1 is used as a BGA package, a metal ball such as a solder ball is adopted as the external connection terminal. When the semiconductor device 1 is used as an LGA package, a metal land is adopted as the external connection terminal.

The connecting pad 4 of the wiring substrate 2 and the electrode pad 5 of the semiconductor chip 3 are electrically and mechanically connected via the solder connecting part 6. The solder connecting part 6 is formed by bringing the solder bump formed on the electrode pad 5 of the semiconductor chip 3 via a barrier metal layer (not shown in FIG. 1) into contact with a preliminary solder layer formed on the connecting pad 4 of the wiring substrate 2 via a barrier metal layer (not shown in FIG. 1) as necessary and then melting the solder bump and the preliminary solder layer by heating them to a temperature equal to or higher than their melting points. The semiconductor chip 3 is mounted on the wiring substrate 2 by adopting FC connection. The semiconductor device 1 has the solder connecting part 6 as an FC connecting part.

In the gap between the wiring substrate 2 and the semiconductor chip 3, an underfill resin 7 is filled. The underfill resin 7 is composed of a thermosetting resin and cured by curing treatment (thermosetting treatment). Such an underfill resin 7 protects the solder bumps 6. For the underfill resin 7, a thermosetting resin such as, for example, epoxy resin, phenol resin, silicone resin, polyimide resin or the like is used. Further, a sealing resin layer 8 is formed on the wiring substrate 2. The semiconductor chip 3 is covered by the sealing resin layer 8.

Figure 2A:
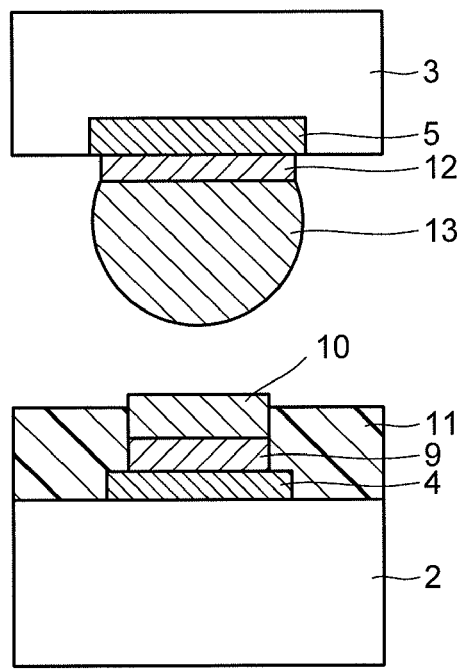
FIG. 2A and FIG. 2B are sectional views illustrating manufacturing processes of the semiconductor device according to the embodiment.
Figure 2B:
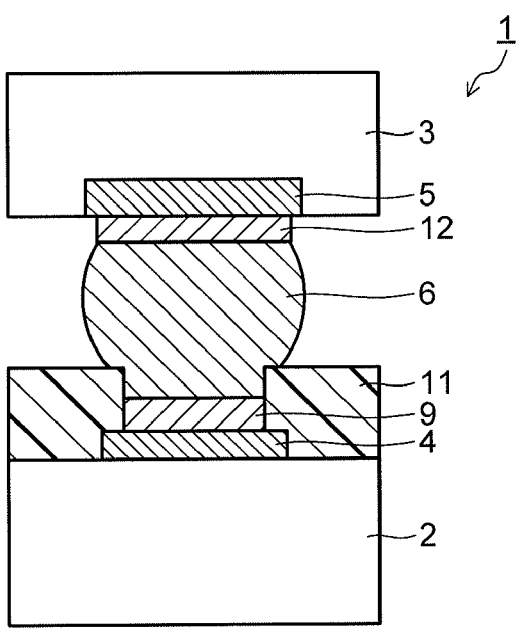

Next, the method for manufacturing the above-described semiconductor device 1, namely, the FC connecting process of the wiring substrate 2 and the semiconductor 3 will be described with reference to FIGS. 2A and 2B. As illustrated in FIG. 2A, a preliminary solder layer 10 is formed on the connecting pad (Cu pad) 4 of the wiring substrate 2 via a barrier metal layer 9. The preliminary solder layer 10 may be directly formed on the connecting pad 4 as will be described later. Note that a numeral 11 in the drawings denotes a solder resist layer. On the other hand, a solder bump 13 is formed on the electrode pad (Cu/Al pad) 5 of the semiconductor chip 3 via a barrier metal layer 12. The preliminary solder layer 10 and the solder bump 13 are formed of a Sn alloy (Sn-based alloy). As the barrier metal layer 12 on the semiconductor chip 3, a Ni/Ti stacked film, a Ni/Cu/Ti stacked film, a Pd/Ni/Ti stacked film or the like is adopted.

After a flux for connection is applied, as necessary, on the wiring substrate 2 having the preliminary solder layer 10 thereon, the semiconductor chip 3 having the solder bump 13 is placed on the wiring substrate 2. The semiconductor chip 3 is placed such that after the electrode pad 5 is aligned with the connecting pad 4 of the wiring substrate 2, the solder bump 13 provided on the electrode pad 5 is contact with the preliminary solder layer 10 provided on the connecting pad 4. By melting the solder bump 13 and the preliminary solder layer 10 by heating to a temperature equal to or higher than the melting points thereof, the solder connecting part 6 connecting the connecting pad 4 of the wiring substrate 2 and the electrode pad 5 of the semiconductor chip 3 is formed as illustrated n FIG. 2B. The wiring substrate 2 and the semiconductor chip 3 are mechanically and electrically connected via the solder connecting part 6.

Between the wiring substrate 2 and the semiconductor chip 3, a gap is made based on the height of the solder connecting part 6. Into the gap between the wiring substrate 2 and the semiconductor chip 3, a thermosetting resin composition (liquid resin) that will be the underfill resin 7 is injected and subjected to curing treatment to be cured, thereby forming the underfill resin 7 made of the thermosetting resin which has been thermoset. Thus, by fixing the semiconductor chip 3 to the wiring substrate 2 while protecting the solder connecting part 6 with the underfill resin 7, the semiconductor device 1 illustrated in FIG. 1 is manufactured. On the second surface 2b of the wiring substrate 2, external connection terminals are formed as necessary.

For the material for forming the preliminary solder layer 10 and the solder bump 13, a Sn alloy enabling the solder connecting part 6 to be constituted of a Sn alloy containing Ag and Cu is adopted. By composing the solder connecting part 6 of such a Sn alloy, the fatigue, resistance of the solder connecting part 6 can be improved while the thermal stress generated in the solder connecting part 6 is relaxed. When the Sn alloy constituting the solder connecting part 6 contains Cu, the creeping property of the solder connecting part 6 is improved, and thereby can relax the thermal stress generated in the solder connecting part 6 during FC connection and TCT. Accordingly, it becomes possible to suppress a crack and delamination of the semiconductor chip 3, in particular, a crack and delamination of the low-k film.

To obtain the above-described effect of relaxing the thermal stress, the Sn alloy constituting the solder connecting part 6 preferably contains 0.3 mass % or more of Cu. When the content of Cu is less than 0.3 mass %, the creeping property of the solder connecting part 6 cannot be sufficiently improved. The content of Cu is preferably 1 mass % or less. However, in the case where the Sn alloy constituting the solder connecting part 6 contains only Cu, the Sn alloy is embrittled due to growth of crystal grains therein when the thermal stress generated in the solder connecting part 6 is relaxed, and deteriorates the fatigue resistance of the solder connecting part 6. Hence, the Sn alloy constituting the solder connecting part 6 contains Ag in addition to Cu.

The Sn alloy constituting the solder connecting part 6 contains Ag as well as Cu and thereby suppresses the growth of the crystal grains in the Sn alloy. Accordingly, the creeping property of the solder connecting part 6 can be improved based on Cu and the fatigue resistance of the solder connecting part 6 can also be improved. This makes it possible to suppress a crack, breakage and so on of the solder connecting part 6 during TCT. Note that when the content of Cu exceeds 1 mass %, the fatigue resistance of the solder connecting part 6 cannot be sufficiently increased even when the Sn alloy contains an appropriate amount of Ag is contained together with Cu. Therefore, the content of Cu in the Sn alloy is preferably 1 mass % or less.

To improve the fatigue resistance of the solder connecting part 6, the Sn alloy constituting the solder connecting part 6 preferably contains 0.2 mass % or more of Ag. When the content of Ag is less than 0.2 mass %, the fatigue resistance of the solder connecting part 6 cannot be sufficiently improved. However, when the Ag content in the Sn alloy is too high, the solder connecting part 6 becomes too hard and decreases in creeping property. Therefore, the Ag content in the Sn alloy constituting the solder connecting part 6 is preferably 1.5 mass % or less. Further, the Ag content in the Sn alloy is preferably less than 1 mass %. Especially when a Ni film is adopted for the barrier metal layers 9, 12 as will be described later in detail, the Ag content in the Sn alloy is preferably less than 1 mass %.

The solder connecting part 6 is preferably formed of a Sn alloy consisting essentially of Ag in a range from 0.2 to 1.5 mass %, Cu in a range from 0.3 to 1 mass % and the balance of Sn (first Sn-based alloy). The solder connecting part 6 is more preferably formed of a Sn alloy consisting essentially of Ag in a range not less than 0.2 mass % and less than 1.0 mass %, Cu in a range from 0.3 to 1 mass % and the balance of Sn (second Sn-based alloy). The second Sn-based alloy is effective when at least one of the barrier metal layers 9, 12 has a Ni film.

When the solder connecting part 6 is formed of the Sn alloy containing Ag and Cu, only the preliminary solder layer 10 contains Ag. In other words, the preliminary solder layer 10 is formed of a Sn—Ag alloy or a Sn—Ag—Cu alloy, and the solder bump 13 is formed of a Sn—Cu alloy. This makes it easy to control the Cu concentration and the Ag concentration in the Sn alloy constituting the solder connecting part 6 and thus makes it possible to obtain the solder connecting part 6 achieving both the creeping property and the fatigue resistance with high reproducibility.

The preliminary solder layer 10 is preferably composed of a Sn alloy consisting essentially of Ag in a range from 0.4 to 6 mass % and the balance of Sn (Sn-based alloy) or a Sn alloy consisting essentially of Ag in a range from 0.4 to 6 mass %, Cu in a range from 0.5 to 1 mass % and the balance of Sn (Sn-based alloy). The Ag content in the Sn alloy is more preferably in a range from 0.4 to 4 mass %. The solder bump 13 is preferably formed of a Sn alloy consisting essentially of Cu in a range from 0.5 to 1 mass % and the balance of Sn (Sn-based alloy).

The compositions of the Sn alloys forming the preliminary solder layer 10 and the solder bump 13 are set as necessary according to the objective composition of the Sn alloy constituting the solder connecting part 6 and the shapes of the preliminary solder layer 10 and the solder bump 13. The composition of the Sn alloy constituting the solder connecting part 6 is based on the alloy compositions and the volume of the preliminary solder layer 10 and the solder bump 13. The volume of the solder bump 13 is determined based on the thickness of the solder bump 13 and the size of the barrier metal layer 12 formed on the electrode pad (Cu/Al pad) 5. The volume of the preliminary solder layer 10 is determined based on the opening size by the solder resist layer 11 on the connecting pad (Cu pad) 4 and the design (the thickness and the opening diameter) of a solder printing mask and so on.

In the case where the volume ratio between the solder bump 13 and the preliminary solder layer 10 is 2:1, for example, when the solder bump 13 is formed of a Sn alloy containing 0.75 mass % of Cu and the preliminary solder layer 10 is formed of a Sn alloy containing 3.5 mass % of Ag (Example 1), the alloy composition of the solder connecting part 6 after FC connection is about Sn-1.2 mass % Ag-0.7 mass % Cu. The Ag concentration of the solder connecting part 6 after FC connection is about ⅓ from the volume ratio between the solder bump 13 and the preliminary solder layer 10. However, the Cu concentration is not determined only from the volume ratio between the solder bump 13 and the preliminary solder layer 10. This is because Cu diffuses from the Cu pad (connecting pad) 4 into the solder connecting part 6.

In the case where the barrier metal layer 9 such as a Ni film or the like does not exist on the Cu pad 4, when the preliminary solder layer 10 is formed on the Cu pad 4 of the wiring substrate 2, Cu diffuses into the preliminary solder layer 10 made of the Sn—Ag alloy. Accordingly, the Cu concentration of the solder connecting part 6 after FC connection is apt to be higher than the concentration (0.5 mass %) determined based on the volume ratio between the solder bump 13 and the preliminary solder layer 10. In the combination of the solder bump 13 and the preliminary solder layer 10 in Example 1, the Cu concentration in the Sn alloy constituting the solder connecting part 6 is about 0.7 mass %.

However, even if the barrier metal layer 9 such as a Ni film or the like is not formed on the Cu pad 4 of the wiring substrate 2, when a $Cu_6Sn_5$ layer that is a Cu—Sn alloy is formed by metal diffusion, this $Cu_6Sn_5$ layer acts like a barrier and thus suppresses diffusion of Cu into the solder connecting part 6. For example, even when a Sn-0.75 mass % Cu solder (eutectic solder) is used both for the solder bump and the preliminary solder layer, the Cu concentration of the solder connecting part after FC connection is less than 1 mass %. Conversely, even when a Sn—Ag alloy-based solder containing no Cu is used both for the solder bump and the preliminary solder layer, the Cu concentration of the solder connecting part is about 0.3 mass %.

In the case where the volume ratio between the solder bump 13 and the preliminary solder layer 10 is 2:1 as in Example 1, when the solder bump 13 is formed of a Sn alloy containing 0.75 mass % of Cu and the preliminary solder layer 10 is formed of a Sn alloy containing 3.0 mass % of Ag and 0.5 mass % of Cu (Example 2), the alloy composition of the solder connecting part 6 after FC connection is about Sn-1.0 mass % Ag-0.8 mass % Cu. The difference in Cu concentration in the Sn alloy constituting the solder connecting part 6 is smaller as compared to Example 1 because the preliminary solder layer 10 is formed of a Sn—Ag—Cu alloy.

Further, the solder bump 13 made of the Sn—Cu alloy is preferably formed by stacking of Sn plating and Cu plating or mounting a Sn—Cu alloy ball (solder ball made of a Sn—Cu alloy). This makes it possible to reduce the forming cost of the solder bump 13 and the manufacturing cost of the semiconductor device 1. In the case where the solder bump 13 is formed of the Sn alloy containing Ag, when it is tried to adopt stacked plating, Ag plating is formed in a recessed shape and greatly varies in film thickness, and it is difficult to control a very low concentration of about several percents. Therefore, electrolytic plating using an alloy plating solution needs to be adopted, but the alloy plating causes an increase in cost of forming the solder bump as described above.

Based on the conditions of the above-described Example 1 and Example 2 (alloy compositions and volume of the solder bump 13 and the preliminary solder layer 10, alloy composition of the solder connecting part 6), a TCT with one cycle of −55° C. for 20 minutes → room temperature (25° C.) for 20 minutes → 125° C. for 20 minutes was carried out using a sample made by FC-connecting the semiconductor chip 3 to the wiring substrate 2 and filling the underfill 7 between the wiring substrate 2 and the semiconductor chip 3. In both of the semiconductor devices of Example 1 and Example 2, separation of the low-k film and occurrence of a crack, breakage and so on of the solder connecting part 6 were not found even after a reliability quality judgment cycle. Further, since the stacked plating is applied to formation of the solder bump 13, it was possible to reduce the forming cost of the solder bump 13.

On the other hand, TCT was carried out similarly to the Examples using a sample made by FC-connecting a semiconductor chip having a solder bump made of a Sn alloy containing 3.5 mass % of Ag to a wiring substrate having a preliminary solder layer made of a Sn alloy containing 0.7 mass % of Cu (Comparative Example 1) and a Sn alloy containing 1.0 mass % of Ag and 0.5 mass % of Cu (Comparative Example 2) and filling the underfill resin between the wiring substrate and the semiconductor chip. As a result, separation of the low-k film was found after a reliability quality judgment cycle in Comparative Example 1 and Comparative Example 2.

Further, TCT was carried out similarly to the Examples using a sample made by FC-connecting a semiconductor chip having a solder bump made of a Sn alloy containing 0.7 mass % of Cu to a wiring substrate having a preliminary solder layer made of a Sn alloy containing 0.7 mass % of Cu and filling the underfill resin between the wiring substrate and the semiconductor chip (Comparative Example 3). As a result, a solder crack was found after a reliability quality judgment cycle in Comparative Example 3.

The composition of the Sn alloy constituting the solder connecting part 6 is preferably set as necessary even according to the configurations of the barrier metal layers 9, 12. Note that the examples which do not adopt the barrier metal layers 9, 12 are as have been described above. For example, when the solder bump 13 is formed of the Sn alloy having the same composition as that of Example 2 and the preliminary solder layer 10 is formed of the Sn alloy having the same composition as that of Example 2 on the Cu pad 4 of the wiring substrate 2 via the barrier metal layer 9 made of a Au/Ni film (stacked plating film) (Example 3), the alloy composition of the solder connecting part 6 after FC connection becomes Sn-1.0 mass % Ag-0.8 mass % Cu as in Example 2. The Ni film in the barrier metal layer 9 inhibits diffusion of Cu into the solder connecting part 6 and therefore improves the controllability of the Cu concentration of the solder connecting part 6.

Incidentally, as compared to Example 2, the thermal stress generated in the solder bump 13 increases during FC connection. This is because Ni diffuses from the barrier metal layer 9 formed on the Cu pad 4 of the wiring substrate 2 into the solder connecting part 6. Ni has properties similar to those of Ag and increases the hardness of solder while decreasing the creeping property of the solder. If a Au/Ni stacked film is formed in a configuration such that the Ag concentration of the solder connecting part 6 after FC connection is 1 mass % or more, as the barrier metal layer 9 on the Cu pad 4, Ni diffuses into the solder connecting part 6 to increase the possibility of separation of the low-k film during FC connection or TCT.

When a Au/Ni stacked film or the like is adopted as the barrier metal layer 9, in other words, when the barrier metal layer 9 having a Ni film whose Ni diffuses into the solder connecting part 6 is adopted, the solder connecting part 6 is preferably composed of a Sn alloy having a Ag concentration of less than 1 mass %. With the solder connecting part 6 made of a Sn alloy containing Ag in a range not less than 0.2 mass % and less than 1.0 mass % and Cu in a range from 0.3 to 1 mass % (Example 4), a decrease in creeping property due to the diffusion of Ni can be suppressed. Since Ni acts similarly to Ag, the fatigue resistance can be increased even with a Ag concentration of less than 1 mass %. This also applies to the case where the barrier metal layer 12 of the semiconductor chip 3 has a Ni film whose Ni diffuses into the solder connecting part 6, and the solder connecting part 6 is preferably constituted of a Sn alloy having a Ag concentration of less than 1 mass %.

Further, a configuration using a wiring substrate 2 having a Au/Pd/Ni stacked film or the like as the barrier metal layer 9 (Example 5) is also effective. When the barrier metal layer 9 has a Pd film disposed on the side closer to the preliminary solder layer 10 than the Ni film, the Pd film inhibits diffusion of Ni into the solder connecting part 6, and therefore it is possible to adopt the Ag concentration similar to that in the case where the barrier metal layer 9 is not adopted. Further, since the diffusion of Cu from the Cu pad 4 can be inhibited by the Ni film in the barrier metal layer 9, the Cu concentration of the solder connecting part 6 can be controlled more accurately.

The same applies to a configuration using a semiconductor chip 3 having a Pd/Ni/Ti stacked film or the like as the barrier metal layer 12 (Example 6). When the barrier metal layer 12 has a Pd film disposed on the side closer to the solder bump 13 than the Ni film, the Pd film inhibits diffusion of Ni into the solder connecting part 6, and therefore a Sn alloy having a Ag concentration of 1.5 mass % or less can be adopted for the solder connecting part 6. More specifically, a Sn alloy containing Ag in a range from 0.2 to 1.5 mass % and Cu in a range from 0.3 to 1 mass % can be adopted for the solder connecting part 6.

While certain embodiments have been described, there embodiments have been presented by way of example only, and are not intended to limit the scope of the inventions. Indeed, the novel methods described herein may be embodied in a variety of other forms, furthermore, various omissions, substitutions and changes in the form of the inventions. The accompanying claims and their equivalent s are intended to cover such forms or modifications as would fall within the scope and spirit of the inventions.

What is claimed is:

1. A method for manufacturing a semiconductor device, comprising:
    forming a preliminary solder layer made of a first Sn alloy containing Ag on a connecting pad of a wiring substrate;
    forming a solder bump made of a second Sn alloy not containing Ag on an electrode pad of a semiconductor chip;
    contacting the preliminary solder layer and the solder bump while aligning; and
    melting the preliminary solder layer and the solder bump by heating to a temperature equal to or higher than melting points thereof to form a solder connecting part made of a third Sn alloy containing Ag and Cu and connect the connecting pad of the wiring substrate and the electrode pad of the semiconductor chip.

2. The method for manufacturing a semiconductor device according to claim 1,
    wherein the preliminary solder layer is composed of a Sn—Ag alloy or a Sn—Ag—Cu alloy, and the solder bump is composed of a Sn—Cu alloy.

3. The method for manufacturing a semiconductor device according to claim 1,
    wherein the preliminary solder layer is composed of the first Sn alloy consisting essentially of one of Ag in a range from 0.4 to 6 mass % and the balance of Sn, or Ag in a range from 0.4 to 6 mass %, Cu in a range from 0.4 to 6 mass % and the balance of Sn.

4. The method for manufacturing a semiconductor device according to claim 1,
wherein the solder bump is composed of the second Sn alloy consisting essentially of Cu in a range from 0.5 to 1 mass % and the balance of Sn.

5. The method for manufacturing a semiconductor device according to claim 1,
wherein the solder connecting part is composed of the third Sn alloy consisting essentially of Ag in a range from 0.2 to 1.5 mass %, Cu in a range from 0.3 to 1 mass % and the balance of Sn.

6. The method for manufacturing a semiconductor device according to claim 1,
wherein the solder bump is formed by stacked plating.

7. The method for manufacturing a semiconductor device according to claim 2,
wherein the solder bump is formed by stacking of Sn plating and Cu plating on the electrode pad.

8. The method for manufacturing a semiconductor device according to claim 2,
wherein the solder bump is formed by mounting a Sn—Cu alloy ball on the electrode pad.

9. The method for manufacturing a semiconductor device according to claim 1,
wherein the solder bump is formed on the electrode pad via a barrier metal layer.

10. A method for manufacturing a semiconductor device, comprising:
forming a preliminary solder layer made of a first Sn alloy containing Ag on a connecting pad of a wiring substrate via a first barrier metal layer;
forming a solder bump made of a second Sn alloy not containing Ag on an electrode pad of a semiconductor chip via a second barrier metal layer;
contacting the preliminary solder layer and the solder bump while aligning; and
melting the preliminary solder layer and the solder bump by heating to a temperature equal to or higher than melting points thereof to form a solder connecting part made of a third Sn alloy containing Ag and Cu and connect the connecting pad of the wiring substrate and the electrode pad of the semiconductor chip.

11. The method for manufacturing a semiconductor device according to claim 10,
wherein the preliminary solder layer is composed of a Sn—Ag alloy or a Sn—Ag—Cu alloy, and the solder bump is composed of a Sn—Cu alloy.

12. The method for manufacturing a semiconductor device according to claim 10,
wherein the preliminary solder layer is composed of the first Sn alloy consisting essentially of one of Ag in a range from 0.4 to 6 mass % and the balance of Sn, or Ag in a range from 0.4 to 6 mass %, Cu in a range from 0.5 to 1 mass % and the balance of Sn.

13. The method for manufacturing a semiconductor device according to claim 10,
wherein the solder bump is composed of the second Sn alloy consisting essentially of Cu in a range from 0.5 to 1 mass % and the balance of Sn.

14. The method for manufacturing a semiconductor device according to claim 10,
wherein at least one of the first barrier metal layer or the second barrier metal layer has a Ni film, and
wherein the solder connecting part is composed of the third Sn alloy consisting essentially of Ag in a range not less than 0.2 mass % and less than 1 mass %, Cu in a range from 0.3 to 1 mass % and the balance of Sn.

15. The method for manufacturing a semiconductor device according to claim 10,
wherein the first barrier metal layer has a Ni film and a Pd film disposed on a side closer to the preliminary solder layer than the Ni film, and
wherein the solder connecting part is composed of the third Sn alloy consisting essentially of Ag in a range from 0.2 to 1.5 mass %, Cu in a range from 0.3 to 1 mass % and the balance of Sn.

16. The method for manufacturing a semiconductor device according to claim 10,
wherein the second barrier metal layer has a Ni film and a Pd film disposed on a side closer to the solder bump than the Ni film, and
wherein the solder connecting part is composed of the third Sn alloy consisting essentially of Ag in a range from 0.2 to 1.5 mass %, Cu in a range from 0.3 to 1 mass % and the balance of Sn.

17. The method for manufacturing a semiconductor device according to claim 11,
wherein the solder bump is formed by stacking of Sn plating and Cu plating or by mounting a Sn—Cu alloy ball.

* * * * *